(12) United States Patent
Wang et al.

(10) Patent No.: US 11,282,910 B2
(45) Date of Patent: Mar. 22, 2022

(54) ARRAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Li Wang, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/635,058

(22) PCT Filed: Jan. 23, 2019

(86) PCT No.: PCT/CN2019/072823
§ 371 (c)(1),
(2) Date: Jan. 29, 2020

(87) PCT Pub. No.: WO2020/150920
PCT Pub. Date: Jul. 30, 2020

(65) Prior Publication Data
US 2021/0020720 A1    Jan. 21, 2021

(51) Int. Cl.
*H01L 27/32* (2006.01)
*H01L 23/552* (2006.01)
*H01L 27/12* (2006.01)

(52) U.S. Cl.
CPC ........ *H01L 27/3272* (2013.01); *H01L 23/552* (2013.01); *H01L 27/1248* (2013.01); *H01L 27/1259* (2013.01); *H01L 27/1255* (2013.01); *H01L 2227/323* (2013.01)

(58) Field of Classification Search
CPC .............. H01L 27/3272; H01L 23/552; H01L 27/1248; H01L 27/1259; H01L 27/1255; H01L 2227/323
USPC .......................................... 257/71
See application file for complete search history.

(56) References Cited

U.S. PATENT DOCUMENTS

| | | | |
|---|---|---|---|
| 7,733,453 B2 * | 6/2010 | Ahn ...................... | G02F 1/1362 349/141 |
| 2001/0007779 A1 * | 7/2001 | Lee ....................... | H01L 27/124 438/30 |
| 2011/0050672 A1 * | 3/2011 | Choi ................... | H01L 27/1255 345/211 |

(Continued)

OTHER PUBLICATIONS

English Machine Translation of CN 104064601A (Year: 2014).*

*Primary Examiner* — Dzung Tran
(74) *Attorney, Agent, or Firm* — The Webb Law Firm

(57) ABSTRACT

The present disclosure provides an array substrate, a manufacturing method thereof, and a display device. The array substrate includes: a base substrate, a gate on the base substrate, a conductive wire above the base substrate, a first insulating layer on the gate and the base substrate, and a shielding structure on the base substrate. A first orthographic projection of the conductive wire on the base substrate is spaced apart from a second orthographic projection of the gate on the base substrate. A third orthographic projection of the shielding structure on the base substrate is located between the first orthographic projection and the second orthographic projection. The shielding structure is used to at least partially shield a crosstalk of the conductive wire to the gate.

16 Claims, 4 Drawing Sheets

(56) References Cited

U.S. PATENT DOCUMENTS

2014/0167009 A1* 6/2014 Lee .................... H01L 23/5225
                                                      257/40
2016/0126256 A1* 5/2016 Hwang ................ H01L 27/124
                                                      257/72

* cited by examiner

ARRAY SUBSTRATE, MANUFACTURING METHOD THEREOF, AND DISPLAY DEVICE

CROSS-REFERENCE TO RELATED APPLICATIONS

The present application is a U.S. National Stage Application under 35 U.S.C. § 371 of International Patent Application No. PCT/CN2019/072823, filed on Jan. 23, 2019, the disclosure of which is incorporated by reference herein in its entirety.

TECHNICAL FIELD

The present disclosure relates to an array substrate, a manufacturing method thereof, and a display device.

BACKGROUND

In OLED (Organic Light Emitting Diode) display screens of the related art, there are a data signal line, a power supply voltage line, a reference signal line, a driving transistor, and the like. The data signal line is used to transmit a data signal. The power supply voltage line is used to transmit a power supply voltage signal VDD. The reference signal line is used to transmit a reference voltage signal $V_{ref}$. A gate of the driving transistor is used to receive a gate voltage signal.

SUMMARY

According to one aspect of embodiments of the present disclosure, an array substrate is provided. The array substrate comprises: a base substrate; a gate on the base substrate; a conductive wire above the base substrate, wherein a first orthographic projection of the conductive wire on the base substrate is spaced apart from a second orthographic projection of the gate on the base substrate; a first insulating layer on the gate and the base substrate, wherein a portion of the first insulating layer is between the base substrate and the conductive wire; and a shielding structure on the base substrate, wherein a third orthographic projection of the shielding structure on the base substrate is located between the first orthographic projection and the second orthographic projection, the shielding structure is used to at least partially shield a crosstalk of the conductive wire to the gate, a thickness of the shielding structure in a direction perpendicular to the base substrate is greater than that of a portion of the first insulating layer on the gate in the direction perpendicular to the base substrate, and the thickness of the shielding structure in the direction perpendicular to the base substrate is greater than that of a portion of the first insulating layer between the base substrate and the conductive wire in the direction perpendicular to the base substrate.

In some embodiments, the array substrate further comprises a first conductive layer covering at least the shielding structure.

In some embodiments, a material of the shielding structure is the same as that of the first insulating layer, and the shielding structure and the first insulating layer form an integrated structure.

In some embodiments, the thickness of the shielding structure is 2 to 5 times that of the portion of the first insulating layer on the gate, and the thickness of the shielding structure is 2 to 5 times that of the portion of the first insulating layer between the base substrate and the conductive wire.

In some embodiments, the thickness of the shielding structure ranges from 3000 Å to 8000 Å.

In some embodiments, a slope angle of the shielding structure ranges from 30° to 60°, wherein the slope angle is an angle formed by a side surface of the shielding structure and a bottom surface of the shielding structure.

In some embodiments, the thickness of the shielding structure is inversely related to the slope angle of the shielding structure.

In some embodiments, the first conductive layer comprises an opening exposing a portion of the first insulating layer; and the array substrate further comprises: a second insulating layer on the first insulating layer and the first conductive layer, wherein a portion of the second insulating layer within the opening covers an exposed portion of the first insulating layer, and the conductive wire is on the second insulating layer; and a second conductive layer passing through the second insulating layer and the first insulating layer and connected to the gate.

In some embodiments, the conductive wire is a data signal line; the first conductive layer is used as an electrode plate of a capacitor; and the second conductive layer is used as a lead of the gate.

In some embodiments, a thin film transistor containing the gate is used as a driving transistor of a pixel driving circuit of a display panel.

According to another aspect of embodiments of the present disclosure, a display device is provided. The display device comprises the array substrate as described previously.

According to another aspect of embodiments of the present disclosure, a manufacturing method for an array substrate is provided. The manufacturing method comprises: forming a gate on a base substrate; forming a first insulating layer on the gate and the base substrate; forming a shielding structure on the base substrate; forming a conductive wire on a side of the first insulating layer facing away from the base substrate, wherein a first orthographic projection of the conductive wire on the base substrate is spaced apart from a second orthographic projection of the gate on the base substrate; wherein a third orthographic projection of the shielding structure on the base substrate is located between the first orthographic projection and the second orthographic projection, the shielding structure is used to at least partially shield a crosstalk of the conductive wire to the gate, a thickness of the shielding structure in a direction perpendicular to the base substrate is greater than that of a portion of the first insulating layer on the gate in the direction perpendicular to the base substrate, and the thickness of the shielding structure in the direction perpendicular to the base substrate is greater than that of a portion of the first insulating layer between the base substrate and the conductive wire in the direction perpendicular to the base substrate.

In some embodiments, the manufacturing method further comprising: forming a first conductive layer covering at least the shielding structure.

In some embodiments, a material of the shielding structure is the same as that of the first insulating layer, and the shielding structure and the first insulating layer are integrally formed.

In some embodiments, the step of forming the first insulating layer and the shielding structure comprises: forming an insulating material layer on the gate and the base substrate; and patterning the insulating material layer to form the first insulating layer and the shielding structure.

In some embodiments, the first conductive layer comprises an opening exposing a portion of the first insulating layer; and before forming the conductive wire, the manufacturing method further comprises: forming a second insulating layer on the first insulating layer and the first conductive layer, wherein a portion of the second insulating layer within the opening covers an exposed portion of the first insulating layer, and the conductive wire is formed on the second insulating layer.

In some embodiments, before forming the conductive wire, the manufacturing method further comprises: etching the second insulating layer and the first insulating layer to form a through hole exposing at least a portion of the gate; and the manufacturing method further comprises: forming a second conductive layer and the conductive wire by a same patterning process and using a same material, wherein the second conductive layer passes through the through hole and is connected to the gate.

In some embodiments, the thickness of the shielding structure is 2 to 5 times that of the portion of the first insulating layer on the gate, and the thickness of the shielding structure is 2 to 5 times that of the portion of the first insulating layer between the base substrate and the conductive wire.

In some embodiments, the thickness of the shielding structure ranges from 3000 Å to 8000 Å.

In some embodiments, a slope angle of the shielding structure ranges from 30° to 60°, wherein the slope angle is an angle formed by a side surface of the shielding structure and a bottom surface of the shielding structure.

In some embodiments, the thickness of the shielding structure is inversely related to the slope angle of the shielding structure.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
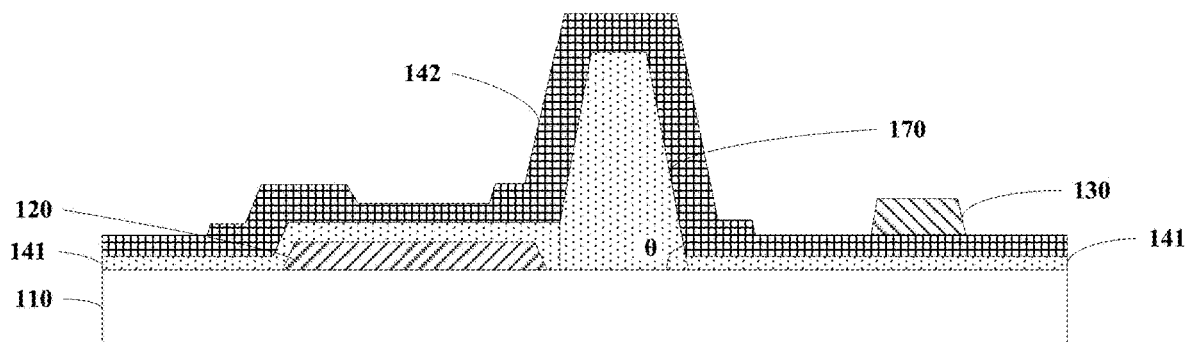
FIG. 1 is a schematic cross-sectional view showing an array substrate according to an embodiment of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In OLED display screens of the related art, due to the presence of a parasitic capacitance, the jump of the data voltage signal in the data signal line may result in other signals (such as the power supply voltage signal, the reference voltage signal, or the gate voltage signal of the driving transistor) jump accordingly.

For example, the gate of the driving transistor is connected to a lead through a through hole of an interlayer dielectric layer, and thus connected to other structures through the lead. The lead of the gate and the data signal line are made of the same layer of metal, so that there is a great fringe field capacitance between the gate and the data signal line. The fringe field capacitance is a parasitic capacitance.

The inventors of the present disclosure have found that, during the light emitting phase of the OLED, the gate of the driving transistor is in a floating state. The gate voltage of the driving transistor is maintained by a storage voltage of a capacitor. After the data voltage in the data signal line jumps, according to the principle of charge conservation, charge of the capacitor and charge of other parasitic capacitors are redistributed. After the electric quantities are redistributed, the voltage of the capacitor changes. This causes it is possible that the gate voltage of the driving transistor is stable at a voltage value, while there is a deviation $\Delta V_g$ between the voltage value and an initial value of the gate voltage, which results in a change in the gate-source voltage $V_{gs}$ of the driving transistor. This may cause distinct brightnesses of different light emitting devices, thereby causing a crosstalk phenomenon. For example, the data voltage jump in the data signal line may affect the brightness of pixels in a pixel column connected to the data signal line, thereby causing a vertical crosstalk phenomenon.

In view of this, the embodiments of the present disclosure provide an array substrate to reduce a crosstalk phenomenon. A structure of the array substrate according to some embodiments of the present disclosure will be described in detail below with reference to the accompanying drawings.

FIG. 1 is a schematic cross-sectional view showing an array substrate according to an embodiment of the present disclosure.

As shown in FIG. 1, the array substrate comprises a base substrate 110. For example, the base substrate 110 may comprise a base substrate layer and a structural layer (not shown) on the base substrate layer. For example, the base substrate layer may comprise a rigid base substrate layer (such as a glass base substrate) or a flexible base substrate layer. For example, the structural layer may comprise related structural layers (for example, a source, a drain, a semiconductor layer, etc.) of the driving transistor, and the like.

As shown in FIG. 1, the array substrate further comprises a gate 120 on the base substrate 110. For example, the gate 120 may be a gate of a thin film transistor. A material of the gate 120 may comprise a metal (for example, molybdenum (Mo)) or the like. In some embodiments, a thin film transistor containing the gate (i.e., a thin film transistor where the gate is located) may be used as a driving transistor of a pixel driving circuit of a display panel (for example, an OLED display panel).

As shown in FIG. 1, the array substrate further comprises a conductive wire 130 above the base substrate 110. A first orthographic projection (not shown) of the conductive wire 130 on the base substrate 110 is spaced apart from a second orthographic projection (not shown) of the gate 120 on the base substrate 110. For example, the conductive wire 130 may be a data signal line. For example, a material of the conductive wire 130 may comprise a metal (for example, copper (Cu), aluminum (Al), molybdenum, or titanium (Ti), etc.). For example, the conductive wire may comprise Ti/Al/Ti layers.

As shown in FIG. 1, the array substrate further comprises a first insulating layer 141 on the gate 120 and the base substrate 110. A portion of the first insulating layer 141 is between the base substrate 110 and the conductive wire 130. For example, a material of the first insulating layer 141 may comprise at least one of silicon dioxide or silicon nitride.

As shown in FIG. 1, the array substrate further comprises a shielding structure 170 on the base substrate 110. A third orthographic projection of the shielding structure 170 on the base substrate 110 is located between the first orthographic projection and the second orthographic projection. In other words, the shielding structure 170 is located between the conductive wire 130 and the gate 120 in a direction parallel to an upper surface of the base substrate 110. The shielding structure 170 is used to at least partially shield a crosstalk of the conductive wire 130 to the gate 120. A thickness of the shielding structure 170 in a direction perpendicular to the base substrate (i.e., a direction perpendicular to the upper surface of the base substrate 110) is greater than that of a portion of the first insulating layer 141 on the gate in the direction perpendicular to the base substrate. The thickness of the shielding structure 170 in the direction perpendicular to the base substrate is greater than that of a portion of the first insulating layer 141 between the base substrate 110 and the conductive wire 130 in the direction perpendicular to the base substrate.

Hitherto, an array substrate according to some embodiments of the present disclosure is provided. In the above-described embodiments, it is possible to reduce the crosstalk of the conductive wire to the gate, and improve the display effect by providing a shielding structure in the array substrate.

In some embodiments, as shown in FIG. 1, a material of the shielding structure 170 is the same as that of the first insulating layer 141, and the shielding structure 170 and the first insulating layer 141 form an integrated structure. This may facilitate the manufacture of the array substrate. In this embodiment, the material of the shielding structure 170 may be an insulating material. In this way, due to the relatively thick shielding structure, an equivalent pitch of the parasitic capacitance formed by the conductive wire and the gate is equivalently increased, so that it is possible to reduce the parasitic capacitance, and to further reduce the crosstalk of the conductive wire to the gate.

In other embodiments, the material of the shielding structure 170 may be different from that of the first insulating layer 141. For example, the material of the shielding structure may comprise a conductive material such as a metal. This may produce a favorable shielding effect on the crosstalk of the conductive wire to the gate.

In other embodiments, the shielding structure may comprise an insulating portion on the base substrate and a conductive portion (e.g., a metal) covering the insulating portion. This not only facilitates the manufacture but also may produce a favorable shielding effect on the crosstalk of the conductive wire to the gate.

In some embodiments, as shown in FIG. 1, the array substrate may further comprise a second insulating layer 142 on the first insulating layer 141. The conductive wire 130 is on the second insulating layer 142.

Figure 2:
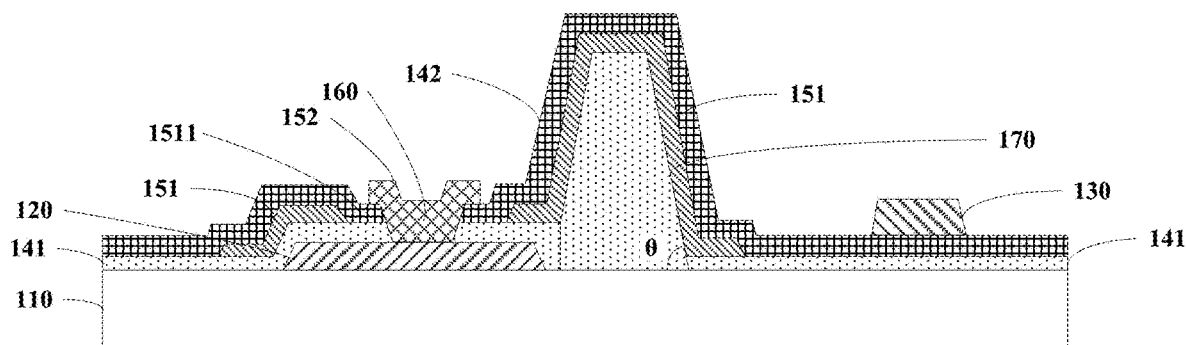
FIG. 2 is a schematic cross-sectional view showing an array substrate according to another embodiment of the present disclosure.
Figure 10:
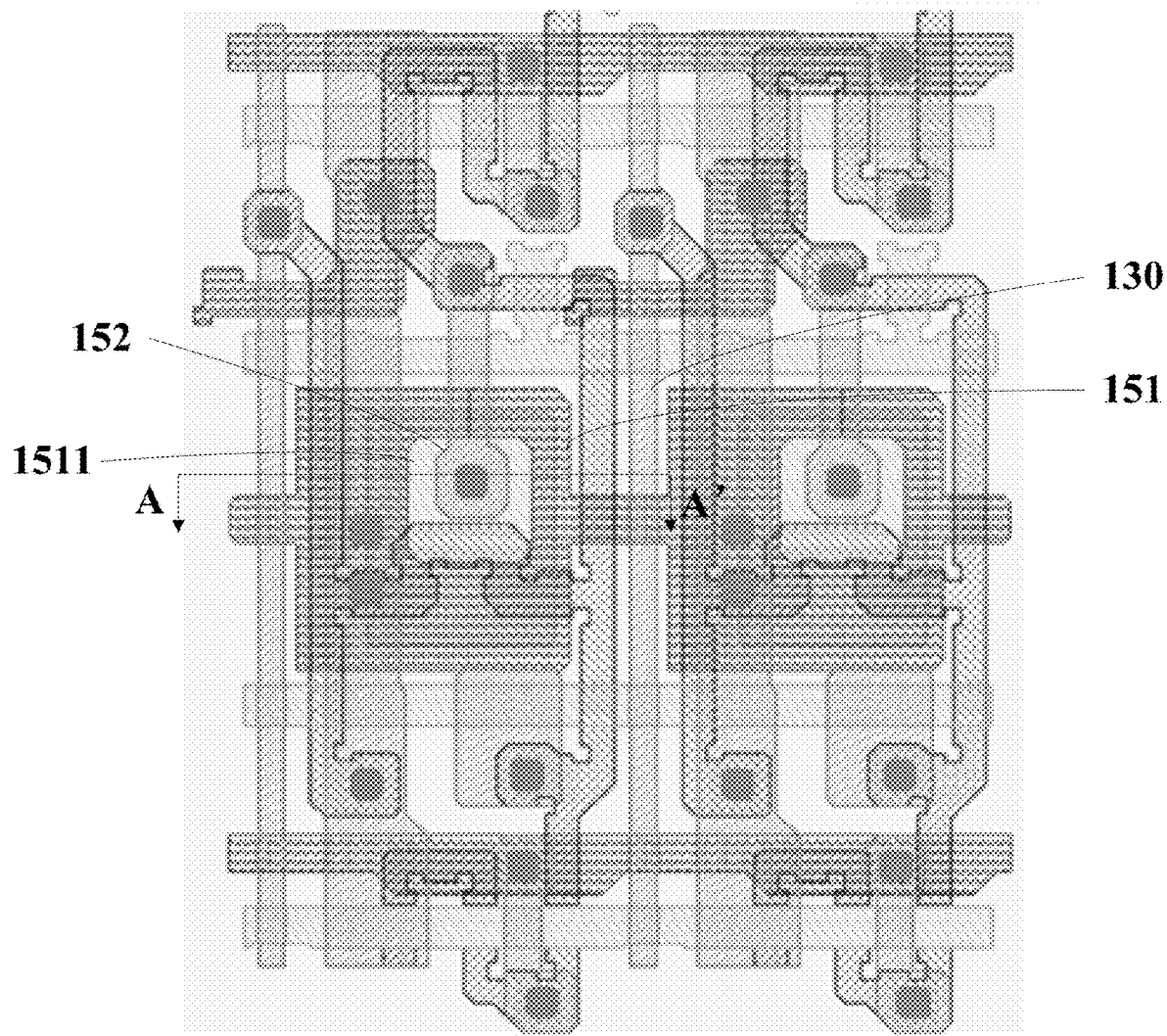
FIG. 10 is a top view showing an array substrate according to an embodiment of the present disclosure.

FIG. 2 is a schematic cross-sectional view showing an array substrate according to another embodiment of the present disclosure. FIG. 2 shows a schematic cross-sectional view of a structure taken along a line A-A' in FIG. 10. Similar to the structure shown in FIG. 1, the array substrate shown in FIG. 2 comprises the base substrate 110, the gate 120, the conductive wire 130, the first insulating layer 141, and the shielding structure 170.

In some embodiments, as shown in FIG. 2, the array substrate may further comprise a first conductive layer 151 covering at least the shielding structure 170. For example, as shown in FIG. 2, a portion of the first conductive layer 151 may also cover the first insulating layer 141. The first conductive layer 151 may be used as an electrode plate of a capacitor (for example, a storage capacitor used in a pixel driving circuit). For example, the gate 120 may be used as another electrode plate of the capacitor. The first conductive layer 151 may be used to receive a power voltage signal. For example, a material of the first conductive layer 151 may comprise a metal (for example, copper, aluminum, molybdenum, or titanium, etc.).

In the array substrate of the above-described embodiments, the first conductive layer is provided on the shielding structure. This may further reduce the influence of the electric field of the data voltage signal in the conductive wire on the corresponding gate voltage, and reduce the parasitic capacitance formed by the conductive wire and the gate. When the data voltage signal jumps, the portion of the first conductive layer covering the shielding structure may weaken the coupling effect between the gate of the driving transistor and the above-mentioned conductive wire (such as the data signal line), thereby reducing the deviation $\Delta V_g$ of the gate voltage signal. Therefore, this embodiment may reduce the crosstalk phenomenon and improve the display effect of the display.

In some embodiments, the thickness of the shielding structure 170 is 2 to 5 times that of the portion of the first insulating layer 141 on the gate 120. The thickness of the shielding structure 170 is 2 to 5 times that of the portion of the first insulating layer 141 between the base substrate 110 and the conductive wire 130. For example, the thickness of the shielding structure 170 may range from 3000 Å to 8000 Å. In this way, it is possible to causes the first conductive layer to produce a relatively favorable shielding effect on the electric field of the data signal line, and it is also possible to reduce a fracture probability of the first conductive layer resulting from an excessively thick shielding structure.

It should be noted that, the thickness of the shielding structure in the embodiments of the present disclosure is not limited to the above-described range. For example, the thickness of the shielding structure may be less than 3000 Å or greater than 8000 Å.

In some embodiments, as shown in FIG. 2, the shielding structure 170 has a slope angle θ. The slope angle θ is an angle formed by a side surface of the shielding structure 170 and a bottom surface of the shielding structure 170.

In some embodiments, the slope angle θ of the shielding structure 170 ranges from 30° to 60°. For example, the slope angle θ may be 45°. The range of the slope angle may not only reduce the fracture probability of the portion of the first conductive layer covering the shielding structure, but also avoid an excessive covering area of the shielding structure as much as possible.

In some embodiments, the thickness of the shielding structure 170 is inversely related to the slope angle θ of the shielding structure 170. For example, the larger the thickness of the shielding structure is, the smaller the slope angle of the shielding structure will be. In this way, it is possible to prevent that the side surface of the shielding structure is too steep, thereby reducing the fracture probability of the portion of the first conductive layer covering the shielding structure. For another example, the smaller the thickness of the shielding structure is, the larger the slope angle of the shielding structure will be. In this way, it is possible to reduce the covering area of the shielding structure.

In the above embodiments, the greater the thickness of the shielding structure is, the better the shielding effect of the first conductive layer on the data voltage signal of the conductive wire will be. The height of the shielding structure may be set within a certain range. In addition, it is possible to adjust the slope angle of the shielding structure within the range allowed by the process, so as to reduce the fracture probability of the portion of the first conductive layer covering the shielding structure.

In some embodiments, as shown in FIG. 2, the first conductive layer 151 comprises an opening 1511 exposing a portion of the first insulating layer 141.

In some embodiments, as shown in FIG. 2, the array substrate may further comprise a second insulating layer 142 on the first insulating layer 141 and the first conductive layer 151. A portion of the second insulating layer 142 is within the opening 1511. The portion of the second insulating layer 142 within the opening 1511 covers an exposed portion of the first insulating layer 141. The conductive wire 130 is on the second insulating layer 142. That is, the conductive wire 130 is on a side of the second insulating layer 142 facing away from the base substrate 110. For example, the second insulating layer 142 may be an interlayer dielectric layer. For example, a material of the second insulating layer 142 may comprise at least one of silicon dioxide or silicon nitride.

In some embodiments, as shown in FIG. 2, the array substrate may further comprise a second conductive layer 152 passing through the second insulating layer 142 and the first insulating layer 141 and connected to the gate 120. The second conductive layer 152 is used as a lead of the gate 120. For example, a material of the second conductive layer 152 may comprise a metal (for example, copper, aluminum, molybdenum, or titanium, etc.).

For example, as shown in FIG. 2, the array substrate may comprise a through hole 160 passing through the second insulating layer 142 and the first insulating layer 141 and exposing at least a portion of the gate 120. The second conductive layer 152 passes through the through hole 160 and is connected to the gate 120.

In some embodiments of the present disclosure, a display device is provided. The display device may comprise an array substrate (such as the array substrate shown in FIG. 1 or 2) as described above. For example, the display device may be any product or component having a display function, such as a display panel, electronic paper, a mobile phone, a tablet computer, a television, a display, a notebook computer, a navigator, or the like.

Figure 3:
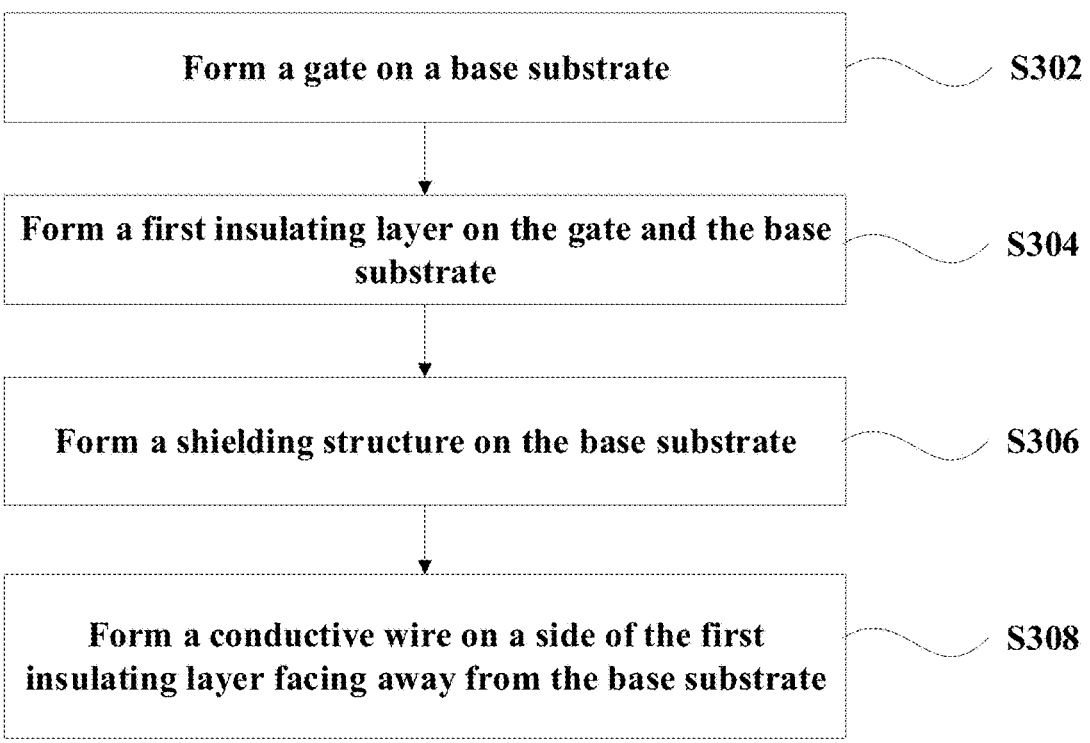
FIG. 3 is a flow chart showing a manufacturing method for an array substrate according to an embodiment of the present disclosure.

FIG. 3 is a flow chart showing a manufacturing method for an array substrate according to an embodiment of the present disclosure. As shown in FIG. 3, the manufacturing method may comprise steps S302 to S308.

At step S302, a gate is formed on a base substrate.

At step S304, a first insulating layer is formed on the gate and the base substrate.

At step S306, a shielding structure is formed on the base substrate.

At step S308, a conductive wire is formed on a side of the first insulating layer facing away from the base substrate. A first orthographic projection of the conductive wire on the base substrate is spaced apart from a second orthographic projection of the gate on the base substrate.

A third orthographic projection of the above-described shielding structure on the base substrate is located between the first orthographic projection and the second orthographic projection. The shielding structure is used to at least partially shield a crosstalk of the conductive wire to the gate. A thickness of the shielding structure in a direction perpendicular to the base substrate is greater than that of a portion of the first insulating layer on the gate in the direction perpendicular to the base substrate. The thickness of the shielding structure in the direction perpendicular to the base substrate is greater than that of a portion of the first insulating layer between the base substrate and the conductive wire in the direction perpendicular to the base substrate.

Hitherto, a manufacturing method for an array substrate according to some embodiments of the present disclosure is provided. In the manufacturing method, a shielding structure is formed between the conductive wire and the gate in a direction parallel to an upper surface of the base substrate, so that it is possible to reduce the crosstalk of the conductive wire to the gate, and improve the display effect of the display.

In some embodiments, a material of the shielding structure is the same as that of the first insulating layer, and the shielding structure and the first insulating layer are integrally formed. For example, the step of forming the first insulating layer and the shielding structure may comprise: forming an insulating material layer on the gate and the base substrate; and patterning the insulating material layer to form the first insulating layer and the shielding structure.

FIGS. 4 to 9 and FIG. 2 are schematic cross-sectional views showing structures at several phases during a manufacturing process of an array substrate according to other embodiments of the present disclosure. Hereinafter, a manufacturing method for an array substrate according to some embodiments of the present disclosure will be described in detail with reference to FIGS. 4 to 9 and FIG. 2.

Figure 4:
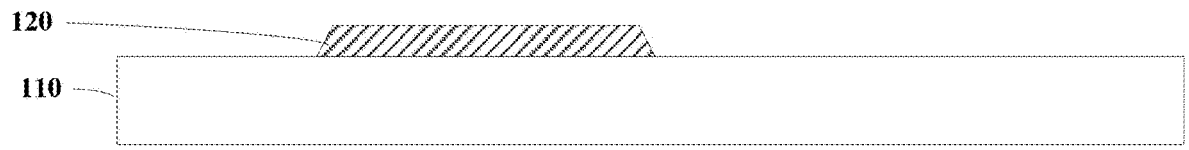
FIG. 4 is a schematic cross-sectional view showing a structure at one phase during a manufacturing process for an array substrate according to another embodiment of the present disclosure.

First, as shown in FIG. 4, the gate 120 formed on the base substrate 110 by processes such as deposition and patterning. The material of the gate 120 may comprise a metal (for example, molybdenum) or the like. For example, the base substrate 110 may comprise a base substrate layer and a structural layer (not shown) on the base substrate layer. For example, the base substrate layer may comprise a rigid base substrate layer (such as a glass base substrate) or a flexible base substrate layer. For example, the structural layer may comprise related structural layers (for example, a source, a drain, a semiconductor layer, etc.) of the driving transistor, or the like.

Figure 5:
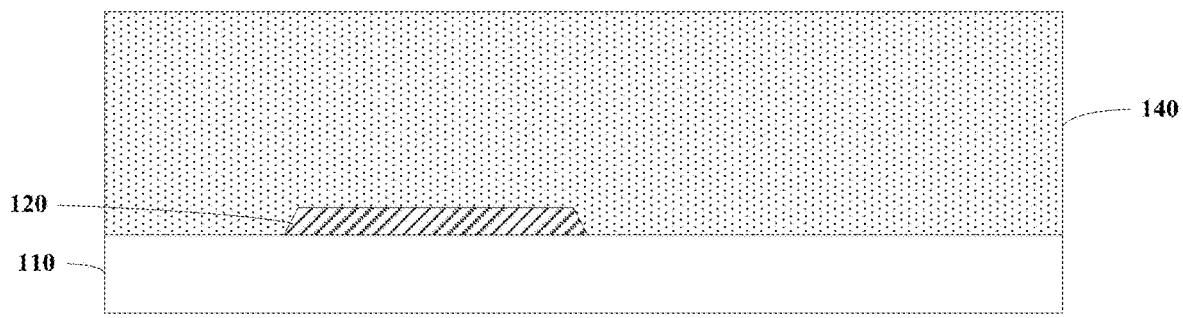
FIG. 5 is a schematic cross-sectional view showing a structure at one phase during a manufacturing process for an array substrate according to another embodiment of the present disclosure.

Next, as shown in FIG. 5, an insulating material layer 140 is formed on the gate 120 and the base substrate 110 by, for example, a deposition process. For example, a material of the insulating material layer 140 may comprise at least one of silicon dioxide or silicon nitride.

Figure 6:
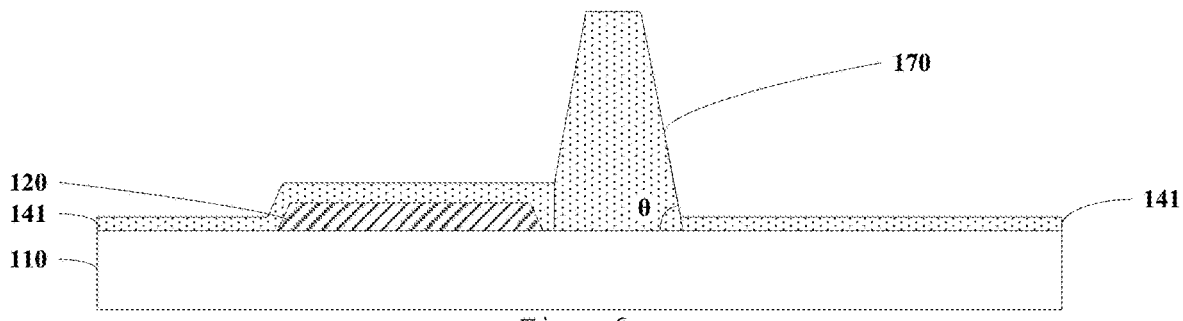
FIG. 6 is a schematic cross-sectional view showing a structure at one phase during a manufacturing process for an array substrate according to another embodiment of the present disclosure.

Next, as shown in FIG. 6, the insulating material layer 140 is patterned to form a first insulating layer 141 and a shielding structure 170. A thickness of the shielding structure 170 in a direction perpendicular to the base substrate 110 is greater than that of a portion of the first insulating layer 141 on the gate 120 in the direction perpendicular to the base substrate 110. The thickness of the shielding structure 170 in the direction perpendicular to the base substrate 110 is greater than that of a portion of the first insulating layer 141 between the base substrate 110 and the conductive wire (to be formed in a subsequent step) in the direction perpendicular to the base substrate 110.

In some embodiments, the thickness of the shielding structure 170 is 2 to 5 times that of the portion of the first insulating layer 141 on the gate 120. The thickness of the shielding structure 170 is 2 to 5 times that of the portion of the first insulating layer 141 between the base substrate 110 and the conductive wire.

In some embodiments, the thickness of the shielding structure 170 may range from 3000 Å to 8000 Å. For example, the thickness of the shielding structure 170 may be 4000 Å, 5000 Å, 6000 Å, 7000 Å, or the like.

In some embodiments, a slope angle θ of the shielding structure 170 ranges from 30° to 60°. The slope angle θ is an angle formed by a side surface of the shielding structure 170 and a bottom surface of the shielding structure 170.

In some embodiments, the thickness of the shielding structure 170 is inversely related to the slope angle θ of the shielding structure 170.

Figure 7:
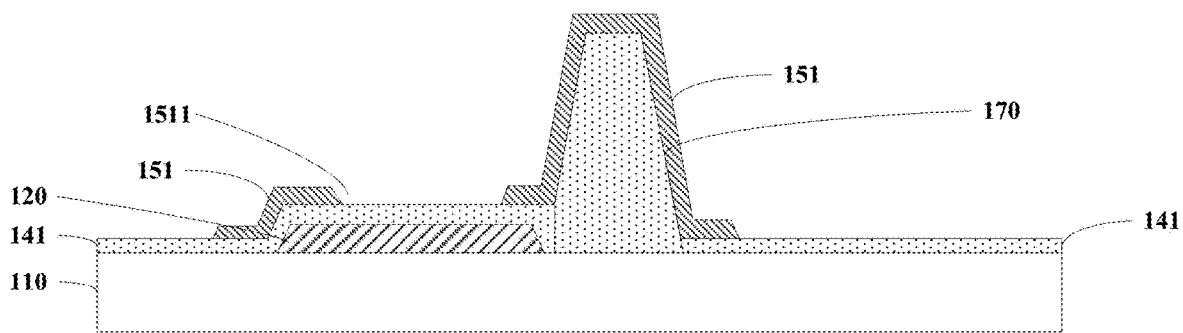
FIG. 7 is a schematic cross-sectional view showing a structure at one phase during a manufacturing process for an array substrate according to another embodiment of the present disclosure.

Next, as shown in FIG. 7, for example, a first conductive layer 151 covering at least the shielding structure 170 is formed by processes such as deposition, photolithography, and etching. For example, the first conductive layer 151 may also be on the first insulating layer 141. At least a portion of the first conductive layer 151 covers the shielding structure 170. For example, as shown in FIG. 7, the first conductive layer 151 comprises an opening 1511 exposing a portion of the first insulating layer 141. The opening 1511 is above the gate 120.

Figure 8:
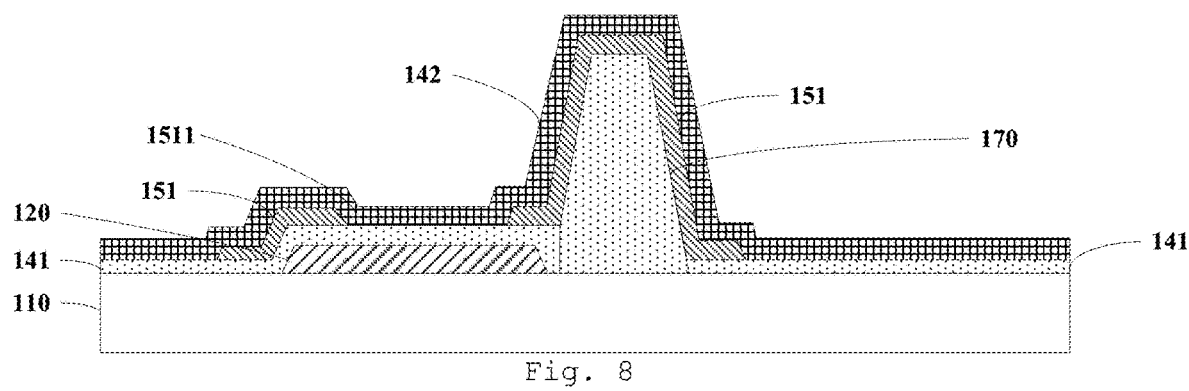
FIG. 8 is a schematic cross-sectional view showing a structure at one phase during a manufacturing process for an array substrate according to another embodiment of the present disclosure.

Next, as shown in FIG. 8, a second insulating layer 142 is formed on the first insulating layer 141 and the first conductive layer 151. A portion of the second insulating layer 142 within the opening 1511 covers an exposed portion of the first insulating layer 141. For example, a material of the second insulating layer 142 may comprise at least one of silicon dioxide or silicon nitride.

Figure 9:
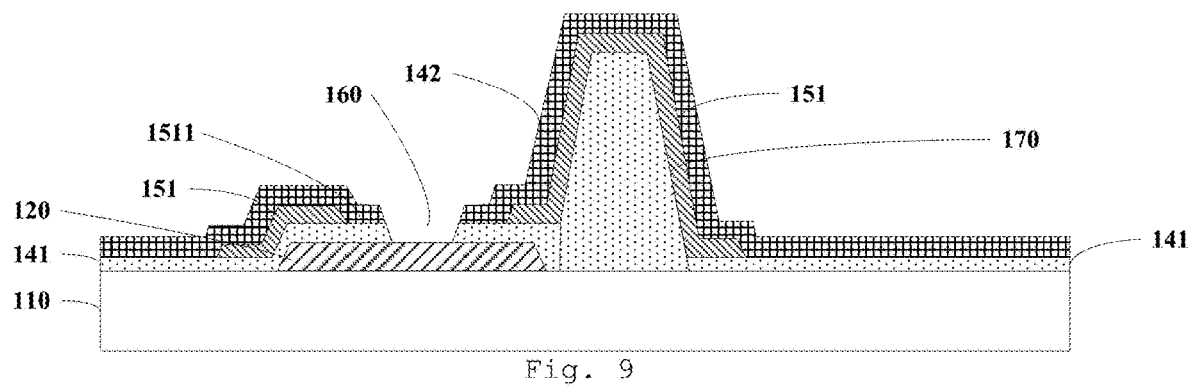
FIG. 9 is a schematic cross-sectional view showing a structure at one phase during a manufacturing process for an array substrate according to another embodiment of the present disclosure.

Next, as shown in FIG. 9, the second insulating layer 142 and the first insulating layer 141 are etched to form a through hole 160 exposing at least a portion of the gate 120. The through hole 160 is inside the opening 1511.

Next, as shown in FIG. 2, a conductive wire 130 is formed on a side of the first insulating layer 141 facing away from the base substrate 110. For example, the conductive wire 130 is formed on the second insulating layer 142. In other embodiments, if there is not a portion of the second insulating layer at the position where the conductive wire is to be formed, the conductive wire 130 may also be formed directly on the first insulating layer 141.

A first orthographic projection (not shown) of the conductive wire 130 on the base substrate 110 is spaced apart from a second orthographic projection (not shown) of the gate 120 on the base substrate 110. A third orthographic projection (not shown) of the shielding structure 170 on the base substrate 110 is located between the first orthographic projection and the second orthographic projection. In other words, the shielding structure 170 is located between the conductive wire 130 and the gate 120 in a direction parallel to the base substrate 110.

In some embodiments, as shown in FIG. 2, during the process of forming the conductive wire, a second conductive layer 152 passing through the through hole 160 and connected to the gate 120 may also be formed. For example, the second conductive layer 152 passing through the through hole 160 and connected to the gate 120 may be formed by a same patterning process as that used to form the conductive wire 130 and using the same material as the conductive wire 130. For example, a metal layer is formed on the structure shown in FIG. 9 by a deposition process, and then the metal layer is patterned to form the conductive wire 130 and the second conductive layer 152. The material of the conductive wire 130 is the same as that of the second conductive layer 152.

In other embodiments, the conductive wire 130 and the second conductive layer 152 may be formed respectively. In this case, the material of the conductive wire 130 may be different from that of the second conductive layer 152.

Hitherto, a manufacturing method for an array substrate according to other embodiments of the present disclosure is provided. In the manufacturing method, a first conductive layer covering at least the shielding structure is formed. This may further reduce the influence of the electric field of the data voltage signal in the conductive wire on the gate voltage, and reduce a parasitic capacitance formed by the conductive wire and the gate of the driving transistor. This may reduce a crosstalk phenomenon and improve the display effect of the display.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the disclosure is defined by the following claims.

What is claimed is:

1. An array substrate, comprising:
   a base substrate;
   a gate on the base substrate;
   a first insulating layer on the gate and on the base substrate;
   a conductive wire on a side of the first insulating layer facing away from the base substrate, wherein a first orthographic projection of the conductive wire on the base substrate is spaced apart from a second orthographic projection of the gate on the base substrate, and a portion of the first insulating layer is between the base substrate and the conductive wire; and
   a shielding structure on the base substrate, wherein a third orthographic projection of the shielding structure on the base substrate is located between the first orthographic projection and the second orthographic projection, the shielding structure is used to at least partially shield a crosstalk of the conductive wire to the gate, a thickness of the shielding structure in a direction perpendicular to the base substrate is greater than that of a portion of the first insulating layer on the gate in the direction perpendicular to the base substrate, and the thickness of the shielding structure in the direction perpendicular to the base substrate is greater than that of a portion of the first insulating layer between the base substrate and the conductive wire in the direction perpendicular to the base substrate,
   wherein the thickness of the shielding structure is 2 to 5 times that of the portion of the first insulating layer on the gate, the thickness of the shielding structure is 2 to 5 times that of the portion of the first insulating layer between the base substrate and the conductive wire, and a slope angle of the shielding structure ranges from 30° to 60°, wherein the slope angle is an angle formed by a side surface of the shielding structure and a bottom surface of the shielding structure.

2. The array substrate according to claim 1, further comprising:
   a first conductive layer covering at least the shielding structure.

3. The array substrate according to claim 1, wherein, a material of the shielding structure is the same as that of the first insulating layer, and the shielding structure and the first insulating layer form an integrated structure.

4. The array substrate according to claim 1, wherein, the thickness of the shielding structure ranges from 3000 Å to 8000 Å.

5. The array substrate according to claim 1, wherein, the thickness of the shielding structure is inversely related to the slope angle of the shielding structure.

6. The array substrate according to claim 2, wherein the first conductive layer comprises an opening exposing a portion of the first insulating layer; and
   the array substrate further comprises:
   a second insulating layer on the first insulating layer and the first conductive layer, wherein a portion of the second insulating layer within the opening covers an exposed portion of the first insulating layer, and the conductive wire is on the second insulating layer; and
   a second conductive layer passing through the second insulating layer and the first insulating layer and connected to the gate.

7. The array substrate according to claim 6, wherein, the conductive wire is a data signal line;
   the first conductive layer is used as an electrode plate of a capacitor; and
   the second conductive layer is used as a lead of the gate.

8. The array substrate according to claim 1, wherein, a thin film transistor containing the gate is used as a driving transistor of a pixel driving circuit of a display panel.

9. A display device, comprising: the array substrate according to claim 1 and a cover plate arranged opposite to the array substrate.

10. A manufacturing method for an array substrate, comprising:
    forming a gate on a base substrate;
    forming a first insulating layer on the gate and the base substrate;
    forming a shielding structure on the base substrate;
    forming a conductive wire on a side of the first insulating layer facing away from the base substrate, wherein a first orthographic projection of the conductive wire on the base substrate is spaced apart from a second orthographic projection of the gate on the base substrate;
    wherein a third orthographic projection of the shielding structure on the base substrate is located between the first orthographic projection and the second orthographic projection, the shielding structure is used to at least partially shield a crosstalk of the conductive wire to the gate, a thickness of the shielding structure in a direction perpendicular to the base substrate is greater than that of a portion of the first insulating layer on the gate in the direction perpendicular to the base substrate, and the thickness of the shielding structure in the direction perpendicular to the base substrate is greater than that of a portion of the first insulating layer between the base substrate and the conductive wire in the direction perpendicular to the base substrate;

wherein the thickness of the shielding structure is 2 to 5 times that of the portion of the first insulating layer on the gate, the thickness of the shielding structure is 2 to 5 times that of the portion of the first insulating layer between the base substrate and the conductive wire, and a slope angle of the shielding structure ranges from 30° to 60°, wherein the slope angle is an angle formed by a side surface of the shielding structure and a bottom surface of the shielding structure.

11. The manufacturing method according to claim 10, further comprising:
    forming a first conductive layer covering at least the shielding structure.

12. The manufacturing method according to claim 10, wherein,
    a material of the shielding structure is the same as that of the first insulating layer, and the shielding structure and the first insulating layer are integrally formed.

13. The manufacturing method according to claim 12, wherein the step of forming the first insulating layer and the shielding structure comprises:
    forming an insulating material layer on the gate and the base substrate; and
    patterning the insulating material layer to form the first insulating layer and the shielding structure.

14. The manufacturing method according to claim 10, wherein,
    the first conductive layer comprises an opening exposing a portion of the first insulating layer; and
    before forming the conductive wire, the manufacturing method further comprises:
    forming a second insulating layer on the first insulating layer and the first conductive layer, wherein a portion of the second insulating layer within the opening covers an exposed portion of the first insulating layer, and the conductive wire is formed on the second insulating layer.

15. The manufacturing method according to claim 14, wherein,
    before forming the conductive wire, the manufacturing method further comprises:
    etching the second insulating layer and the first insulating layer to form a through hole exposing at least a portion of the gate; and
    the manufacturing method further comprises: forming a second conductive layer and the conductive wire by a same patterning process and using a same material, wherein the second conductive layer passes through the through hole and is connected to the gate.

16. The manufacturing method according to claim 10, wherein, the thickness of the shielding structure ranges from 3000 Å to 8000 Å.

* * * * *